United States Patent [19]

Ogasawara

[11] Patent Number: 4,976,808

[45] Date of Patent: Dec. 11, 1990

[54] PROCESS FOR REMOVING A POLYIMIDE RESIN BY DISSOLUTION

[75] Inventor: Shuichi Ogasawara, Ichikawa, Japan

[73] Assignee: Sumitomo Metal Mining Company Limited, Tokyo, Japan

[21] Appl. No.: 507,461

[22] Filed: Apr. 11, 1990

[30] Foreign Application Priority Data

Apr. 22, 1989 [JP] Japan ................................. 1-102956

[51] Int. Cl.$^5$ ............................ B44C 1/22; C23F 1/02; B29C 37/00; C03C 15/00
[52] U.S. Cl. ............................................ 156/638; 134/3; 134/34; 156/656; 156/659.1; 156/655; 156/666; 156/668; 156/902; 252/79.2; 252/79.5; 427/98
[58] Field of Search ............... 156/637, 638, 639, 651, 156/655, 656, 659.1, 666, 668, 902; 427/96, 98; 29/827; 437/206, 220; 252/79.2, 79.5; 204/129.1, 129.65; 134/3, 26, 34

[56] References Cited

U.S. PATENT DOCUMENTS

| 3,820,994 | 6/1974 | Lindberg et al. | 156/639 X |
| 4,632,290 | 1/1987 | Leyden et al. | 156/902 X |
| 4,650,545 | 3/1987 | Laakso et al. | 156/902 X |

Primary Examiner—William A. Powell
Attorney, Agent, or Firm—Watson, Cole, Grindle & Watson

[57] ABSTRACT

When a TAB tape is manufactured from a substrate which has been prepared by forming an electrolessly plated cooper layer on a polyimide resin, and heat treated at a temperature of 120° C. to 420° C., any unwanted portion of the resin is dissolved in a solution containing hydrazine hydrate after the copper layer has been patterned to form leads, and any unwanted portion thereof removed by etching, whereby the unwanted portions of the resin are substantially removed, but an organic substance is formed to remain as an undissolved film. This film is removed by treatment with one or two of a solution containing ammonium ions, a solution containing halogen ions and a solution which can dissolve copper.

5 Claims, No Drawings

PROCESS FOR REMOVING A POLYIMIDE RESIN BY DISSOLUTION

BACKGROUND OF THE INVENTION

1. Field of the Invention:

This invention relates to a process for making a TAB tape. More particularly, it is a process for removing a polyimide resin by dissolving it from a copper-polyimide substrate used for making a TAB tape.

2. Description of the Prior Art:

Polyimide resins are often used as insulating materials in electric or electronic apparatus, since they have excellent heat resistance and are also comparable, or even superior, to other plastics in mechanical, electrical and chemical properties. Printed wiring boards (PWB), flexible printed circuits (FPC), tapes for tape automated bonding (TAB), etc. are each manufactured by photo-etching a copper layer formed on a polyimide-resin base.

When a TAB tape is made, it is further necessary to form holes to expose through the polyimide resin portions of the copper layer defining the inner leads to which IC chips are bonded. These holes are made by punching or dissolving the unwanted portions of the resin.

A copper-polyimide substrate used for making a PWB, FPC, or tape for TAB has usually been prepared by a laminating process, i.e. bonding a copper foil to a polyimide resin with an adhesive. The substrate prepared by the laminating process has, however, been found defective, since impurities, such as chlorine or sulfate ions, are adsorbed to the adhesive layer between the copper film and the polyimide resin during the etching of the copper film or the removal of a photoresist, and are likely to cause a serious problem, such as an insulation failure, particularly when conducting interconnections forming a circuit on the substrate are very close to one another.

Proposals have, therefore, been made to prepare an improved substrate using electroless plating to form a metal layer on the surface of a polyimide resin directly without the aid of any adhesive, or the like. A brief description will be made of a process proposed for preparing a copper-polyimide substrate by forming an electrolessly plated copper layer on the surface of a polyimide resin. The surface of the polyimide resin is rendered hydrophilic by etching in a solution containing an alkali and a reducing agent, and is caused to adsorb, for example, palladium or silver as a catalyst. Then, the resin surface is electrolessly plated with a solution containing copper ions, such as a solution of copper sulfate, whereby a copper film is formed on the resin surface. An electrolytically plated layer of copper may be formed thereon, if required.

The metal layer on the substrate prepared by electroless plating as hereinabove described has a peeling strength of 1500 to 2000 gf/cm at 25° C. which is by far higher than the range of 800 to 1000 gf/cm as has usually been desired in a printed wiring board, or a TAB tape. Its peeling strength is, however, reduced to as low as 100 gf/cm at 25° C. if the substrate is, for example, left for only 10 seconds in a soldering bath held at 290° C.

If the substrate is used to make, for example, a TAB tape, the resulting tape is of very low reliability, since the metal layer cannot withstand a temperature of as high as 300° C. to which it is rapidly heated when the leads of the tape are bonded to IC chips, but lowers its peeling strength rapidly and peels off easily.

We, the inventors of this invention, have studied the possible cause for the low thermal shock resistance of the substrate prepared by the process including electroless plating. We have found that a modified layer of low heat resistance is formed on the surface of the polyimide resin by the etching which is carried out before electroless plating, and that the layer is composed of a substance of the amide series which is soluble in a solution containing cyanogen or a cyanogen compound and used for plating the metal layer patterned to form a circuit on the substrate, and as a result of its dissolution, causes the metal layer to peel off the resin surface.

We have, therefore, proposed a method of preparing an improved copper-polyimide substrate, as is disclosed in U.S. patent application Ser. No. 448,635 filed on Dec. 11, 1989. This method is characterized by the heat treatment of an electrolessly plated substrate at a temperature of 120° C. to 420° C. which is carried out before it is subjected to any thermal shock, as by soldering, or coated with a solution containing cyanogen or a cyanogen compound. This heat treatment is intended for converting the modified layer to a thermally or chemically stable substance having an imide bond by the dehydrocondensation of the amide and carboxyl groups which the modified layer contains.

The proposed method has been found to be capable of producing an improved substrate. When it has been dipped in a soldering bath having a temperature of 315° C. for 10 seconds, the metal layer does not substantially lower its peeling strength, but maintains a peeling strength of 1300 gf/cm which is more than satisfactory for any substrate used for making a TAB tape. Moreover, no peeling of the metal layer results from its dipping in a solution containing cyanogen or a cyanogen compound. The improved heat and chemical resistance of the substrate, as well as the excellent electrical and mechanical properties which it inherently possesses, has made it possible to manufacture reliable products, as far as printed wiring boards and flexible printed circuits are concerned. A different problem has, however, been found to arise when the substrate is used to make a TAB tape, as will hereinafter be pointed out.

The manufacture of a TAB tape using a copperpolyimide substrate having an electrolessly plated copper layer is usually carried out by a process which comprises applying a plating resist to the surface of the substrate, exposing the resist to ultraviolet radiation, developing it to expose predetermined portions of the copper layer, plating the exposed portions of the copper layer electrolytically with copper, removing the resist, applying a polyimide-resin etching resist to the whole surface of the substrate, exposing the resist to ultraviolet radiation, developing it, and dissolving the polyimide resin in a solution containing hydrazine hydrate. When the substrate which has been heat treated in accordance with the proposed method is used to make a TAB tape, however, it has often been the case that the polyimide resin cannot be dissolved or removed satisfactorily, but leave discontinuous organic films having a thickness of, say, 0.01 to 10 microns on the surface of the substrate. The remaining films make it difficult to plate the back surfaces of the copper leads with gold or silver completely and no proper bonding can eventually be achieved between the copper leads and IC chips.

As a result of the recent sophistication of technology relating to TAB, there is known a tape of a polyimide resin provided on both sides thereof with metal layers which are connected to each other through via holes to thereby form a signal layer and a ground layer, respectively, so that no noise may be produced during the transmission of high-frequency signals. The via holes are, however, formed by dissolving the polyimide resin. No complete connection between the metal layers is possible, if the resin is not satisfactorily dissolved to form the via holes, but leaves any such organic film on the surface of either of the metal layers.

We have, therefore, proposed a process for manufacturing an improved TAB tape from a substrate carrying an electrolessly plated copper layer on a polyimide resin, and heat treated at a temperature of 120° C. to 420° C. The proposed process comprises dissolving any unwanted portion of the polyimide resin in a solution containing hydrazine hydrate, whereby the copper layer is partially exposed, and conducting electrolysis by using the exposed copper layer as the cathode and a stainless steel plate, or other insoluble material as the anode to cause gas to rise from the cathode, whereby any remaining organic film is physically removed.

This process is based on the premises that the organic matter remaining undissolved on the copper layer forms a discontinuous film through which the copper layer is partially exposed. As far as such is the case, the electrolysis as proposed is an effective means for removing any such film. We have, however, found that the insoluble organic film remaining after the dissolution of the resin in the solution containing hydrazine hydrate is not always formed on the copper layer alone, and that no such film formed in any other area can be removed completely by electrolysis.

SUMMARY OF THE INVENTION

Under these circumstances, it is an object of this invention to provide a novel process which ensures the effective removal by dissolution of a polyimide resin from a substrate without leaving any undissolved organic film, and thereby enables the manufacture of a TAB tape of high quality from the substrate carrying an electrolessly plated copper layer on the polyimide resin and heat treated at a temperature of 120° C. to 420° C.

This object is attained by a process for manufacturing a TAB tape from a copper-polyimide substrate prepared by forming an electrolessly plated copper layer on a polyimide resin, and heat treated at a temperature of 120° C. to 420° C., characterized by comprising the first step of dissolving any unwanted portion of the polyimide resin in a solution containing hydrazine hydrate, and the second step of dissolving any organic film remaining after the first step in one or two of a solution containing ammonium ions, a solution containing halogen ions, and a solution which can dissolve copper.

The process of this invention enables the complete removal of the polyimide resin from those portions of the substrate in which through holes, etc. are to be formed, and thereby the manufacture of a TAB tape having excellent electrical, mechanical and chemical properties which will provide a highly reliable material for a wide range of electronic devices.

DETAILED DESCRIPTION OF THE INVENTION

Although we have found that the modified layer which is formed on the resin surface as a result of its etching prior to electroless plating is converted by the heat treatment of the substrate to a group of thermally and chemically stable substances containing an imide bond which contribute to improving the adhesion of the metal layer, we have also found that a part of the modified layer does not undergo such conversion, but changes to an organic substance having a chemical structure which renders it sparingly soluble in the hydrazine hydrate solution used for dissolving the resin, and remains as a film.

We have further found that the remaining substance contains phenyl ether and copper, and can be dissolved completely in one or two solutions selected from a solution containing ammonium ions, a solution containing halogen ions and a solution which can dissolve copper.

Aqueous ammonia and aqueous solutions of ammonium salts are examples of the solution containing ammonium ions which can be used for the purpose of this invention. An aqueous solution of hydrogen halide, or of a salt containing a halogen can, for example, be used as the solution containing halogen ions. Examples of the solution which can dissolve copper include an aqueous solution of cupric or ferric chloride, or ammonium, potassium or sodium persulfate, or sulfuric or nitric acid.

Nothing specific can be said about the concentration of any of the three kinds of solutions, or the temperature or time to be employed for dissolving the remaining substance in any such solution, since all of these factors depend upon the thickness of the remaining film and the bonding strength between the film and the metal layer which depend largely upon the conditions employed for the etching prior to electroless plating and for the heat treatment of the substrate. It is necessary to find out the optimum concentration, temperature and time on a case to case basis by conducting some preliminary experiments or other before carrying out the process of this invention.

The removal by dissolution of any remaining organic substance as the second step of the process of this invention can be accomplished if the substrate is dipped in any solution that is employed. According to a preferred aspect of this invention, however, the substrate dipped in the solution is subjected to ultrasonic vibration. The ultrasonic vibration promotes the separation of any such substance from the substrate and thereby enables a drastic reduction in the time required for such treatment.

Incidentally, it is to be noted that no solution used for the second step of the process of this invention dissolves the polyimide resin per se.

The invention will now be described more specifically with reference to several examples.

EXAMPLE 1

A polyimide resin film having a width of 35 mm, a length of 40 mm and a thickness of 50 microns was dipped in an aqueous solution containing 15 mols of hydrazine hydrate and 2 mols of potassium hydroxide per liter and having a temperature of 25° C. and was left to stand for 30 seconds, whereby its surface was etched. After it had been removed from the etching solution and washed with water, the film was dipped in a 5% by weight solution of hydrochloric acid having a temperature of 25° C. After 15 seconds, it was removed from the solution, and after it had been washed with water, it was caused to adsorb a catalyst manufactured by Okuno Pharmaceutical Co., Ltd. and designated as OPC-80 Catalyst M. After this treatment had been continued for five minutes at 25° C., the film was washed with water carefully and the catalyst was given seven minutes of accelerating treatment at 25° C. by an accelerator manufactured by the same Japanese company and designated as OPC-555. After the film had been washed with water again, its surface was left to stand at 20° C. for two minutes to dry. Then, electroless plating was conducted on the surface of the resin film under the conditions shown below by using a bath having the composition shown below, whereby a substrate having a copper layer was obtained:

Bath Composition $CuSO_4.5H_2O$: 10 g/liter
$EDTA.2Na$: 30 g/liter
37% HCHO: 5 ml/liter
Dipyridyl: 20 mg/liter
PEG #1000: 0.5 g/liter Plating Conditions Temperature: 65° C.
Stirring: By air
Time: 10 min.

The substrate was heated for four hours in a heating furnace containing a nitrogen atmosphere held at a temperature of 350° C. Then, the electrolessly plated copper film was coated uniformly with a 40-micron thick layer of a photoresist produced by Tokyo Applied Chemical Industrial Co., Ltd. and designated as PMER N-HC 600 and the photoresist layer was baked at 70° C. for 15 minutes.

After a mask so shaped as to form a TAB tape had been applied to the resist layer, ultraviolet radiation was applied to the resist layer in the amount of 1000 $mJ/cm^2$ by an exposer manufactured by Ushio Electric Corp. and designated as USH-500D. The exposed resist layer was given five minutes of developing treatment at 25° C. in a resist developer produced by Tokyo Applied Chemical Industrial Co., Ltd. and designated as N-A5, whereby the copper film was exposed through the resist layer. Then, electrolytic copper plating was conducted on the exposed film under the conditions shown below by using a bath having the composition shown below:

Bath Composition $CuSO_4.5H_2O$: 120 g/liter
$H_2SO_4$: 150 g/liter

Electrolytic Conditions

Temperature: 25° C.
Cathode current density: 1 $A/dm^2$
Stirring: By air and a cathode rocker
Time: 1 min.

The substrate was left to stand at 60° C. for one minute in a 4% by weight aqueous solution of sodium hydroxide, whereby the resist layer was removed from the electrolessly plated copper film to expose it. Then, the substrate was left to stand at 25° C. for one minute in a 20% by weight aqueous solution of cupric chloride, while the electrolytically plated copper film served as a mask, whereby the exposed portions of the electrolessly plated copper film were removed from the substrate. A photoresist consisting essentially of rubber was applied to the whole surface of the substrate, and was baked. After a mask so shaped as to form through holes for device connection had been applied to the photoresist, it was exposed to ultraviolet radiation and was, then, given a developing treatment. Then, the first step of the process of this invention was carried out under the conditions shown below by using a solution having the composition shown below:

Composition of the Solution

Hydrazine hydrate: 800 ml/liter
Ethylenediamine: 200 ml/liter

Conditions for Dissolution

Temperature: 50° C.
Time: 5 min.

Then, the substrate was washed with water and the second step of the process of this invention was carried out under the conditions shown below by using a solution having the composition shown below for removing any remaining organic film:

Composition of the Solution

Ammonium chloride: 200 g/liter

Conditions for Dissolution

Temperature: 50° C.
Stirring: No stirring was given.
Time: 10 min.

After the second step had been finished, no organic film was found to remain on the substrate any longer. After the photoresist had been removed, the metal layer was plated with gold in a cyanogen solution, whereby a TAB tape was made. It was found to have excellent electrical, mechanical and thermal properties.

EXAMPLE 2

EXAMPLE 1 was repeated in every detail, except that the second step of the process for the removal of the organic film was carried out under the conditions shown below by using a solution having the composition shown Composition of the Solution Ammonium chloride: 1 g/liter Conditions for Dissolution Temperature: 70° C.
Stirring: Ultrasonic
Time: 60 min.

The substrate was found to be completely free of any undesirable organic film. The gold plating procedure of EXAMPLE 1 was, then, followed, and yielded a TAB tape having excellent electrical, mechanical and thermal properties.

EXAMPLE 3

EXAMPLE 1 was repeated in every detail, except for the second step which was carried out under the conditions shown below by using a solution having the composition shown below:

Composition of the Solution

28% aqueous ammonia: 100 ml/liter

Conditions for Dissolution

Temperature: 25° C.
Stirring: Ultrasonic
Time: 5 min.

The substrate was found to be completely free of any undesirable organic film. The gold plating procedure of EXAMPLE 1 was, then, followed, and yielded a TAB tape having excellent electrical, mechanical and thermal properties.

EXAMPLE 4

EXAMPLE 1 was repeated in every detail, except for the second step which was carried out under the conditions shown below by using a solution having the composition shown below:

Composition of the Solution

Hydrochloric acid: 300 ml/liter

Conditions for Dissolution

Temperature: 50° C.
Stirring: No stirring was given.
Time: 5 min.

The substrate was found to be completely free of any undesirable organic film. The gold plating procedure of EXAMPLE 1 was, then, followed, and yielded a TAB tape having excellent electrical, mechanical and thermal properties.

EXAMPLE 5

EXAMPLE 1 was repeated in every detail, except for the second step which was carried out under the conditions shown below by using a solution having the composition shown below:

Composition of the Solution

Ammonium persulfate: 30 g/liter
Sulfuric acid: 10 g/liter

Conditions for Dissolution

Temperature: 25° C.
Stirring: No stirring was given.
Time: 2 min.

The substrate was found to be completely free of any undesirable organic film. The gold plating procedure of EXAMPLE 1 was, then, followed, and yielded a TAB tape having excellent electrical, mechanical and thermal proerties.

COMPARATIVE EXAMPLE 1

EXAMPLE 1 was repeated, except that the second step of the process was replaced by electrolysis. The electrolysis was carried out under the conditions shown below by using an electrolyte having the composition shown below:

Composition of the Electrolyte

Sodium tripolyphosphate: 10 g/liter
Sodium carbonate: 10 g/liter
Sodium hydroxide: 2 g/liter
Sodium lauryl sulfate: 10 mg/liter Electrolytic Conditions Temperature: 50° C.
Anode: Stainless steel plate
Cathode current density: 5 A/dm$^2$
Time: 1 min.

Although the organic film which had existed on the copper layer could be removed completely, the organic film which had formed on the photoresist surface could not be removed completely. It was concluded that the substrate which had been obtained could be used to make only a TAB tape which might cause a contact failure.

What is claimed is:

1. In a process for manufacturing a tape for tape automated bonding from a substrate prepared by forming an electrolessly plated copper layer on a polyimide resin, and heat treated at a temperature of 120° C. to 420° C., said process including patterning said copper layer to form leads, etching any unwanted portion of said copper layer, and removing any unwanted portion of said resin by dissolution from said substrate, the improvement wherein said removing comprises:
   dissolving said unwanted portion of said resin in a solution containing hydrazine hydrate, whereby said resin portion is substantially removed, while an organic substance is formed to remain as an undissolved film; and
   removing said undissolved film by treating it with at least one, but at most two solutions selected from a solution containing ammonium ions, a solution containing halogen ions and a solution which can dissolve copper.

2. A process as set forth in claim 1, wherein said solution containing ammonium ions is selected from aqueous ammonia and an aqueous solution of an ammonium salt.

3. A process as set forth in claim 1, wherein said solution containing halogen ions is selected from an aqueous solution of hydrogen halide and an aqueous solution of a salt containing a halogen.

4. A process as set forth in claim 1, wherein said solution which can dissolve copper is selected from an aqueous solution of cupric chloride, an aqueous solution of ferric chloride, an aqueous solution of ammonium persulfate, an aqueous solution of potassium persulfate, an aqueous solution of sodium persulfate, an aqueous solution of hydrogen peroxide, sulfuric acid and nitric acid, and a mixture of two of said solutions and acids.

5. A process as set forth in any one of claims 1 to 4, wherein ultrasonic agitation is given to said solution used for said removing of said film.

* * * * *